(12) United States Patent
Burenkov

(10) Patent No.: US 9,812,642 B2
(45) Date of Patent: Nov. 7, 2017

(54) RADIATION SOURCE AND METHOD FOR THE OPERATION THEREOF

(71) Applicant: Fraunhofer Gesellschaft Zur Förderung Der Angew. Forschung E.V., München (DE)

(72) Inventor: Alexander Burenkov, Erlangen (DE)

(73) Assignee: Fraunhofer Gesellschaft Zur Forderung Der Angew. Forschung E.V., Munich (DE)

( * ) Notice: Subject to any disclaimer, the term of this patent is extended or adjusted under 35 U.S.C. 154(b) by 134 days.

(21) Appl. No.: 14/766,888

(22) PCT Filed: Feb. 12, 2014

(86) PCT No.: PCT/EP2014/052685
§ 371 (c)(1),
(2) Date: Aug. 10, 2015

(87) PCT Pub. No.: WO2014/124949
PCT Pub. Date: Aug. 21, 2014

(65) Prior Publication Data
US 2016/0013409 A1  Jan. 14, 2016

(30) Foreign Application Priority Data
Feb. 12, 2013  (DE) .......................... 10 2013 202 220

(51) Int. Cl.
 *H01L 49/00* (2006.01)
(52) U.S. Cl.
 CPC ............ *H01L 49/006* (2013.01); *H01L 49/00* (2013.01)
(58) Field of Classification Search
 None
 See application file for complete search history.

(56) References Cited

U.S. PATENT DOCUMENTS 8,304,812 B2 * 11/2012 Onishi ................ H01L 29/0692
257/184
2003/0102494 A1   6/2003  Akamine et al.
(Continued)

FOREIGN PATENT DOCUMENTS

WO       2013016601 A1    1/2013

OTHER PUBLICATIONS

Dyakonov, Michael et al., "Shallow Water Analogy for a Ballistic Field Effect Transistor: New Mechanism of Plasma Wave Generation by dc Current," The American Physical Society, vol. 71(15), Oct. 11, 1993.

(Continued)

*Primary Examiner* — Robert Carpenter
(74) *Attorney, Agent, or Firm* — Alix, Yale & Ristas, LLP

(57) ABSTRACT

The invention relates to a radiation source, comprising at least one semiconductor substrate, on which at least two field-effect transistors are formed, which each contain a gate electrode, a source contact, and a drain contact, which bound a channel, wherein the at least two field-effect transistors are arranged adjacent to each other on the substrate, wherein each field-effect transistor has exactly one gate electrode and at least one source contact and/or at least one drain contact is arranged between two adjacent gate electrodes, wherein a ballistic electron transport can be formed in the channel during operation of the radiation source. The invention further relates to a method for producing electromagnetic radiation having a vacuum wavelength between approximately 10 μm and approximately 1 mm.

20 Claims, 2 Drawing Sheets

(56) References Cited

U.S. PATENT DOCUMENTS

2008/0212975 A1 9/2008 Burenkov
2008/0315216 A1 12/2008 Otsuji et al.

OTHER PUBLICATIONS

Leuther, A. et al., "20 nm Metamorphic HEMT with 660 GHz FT," 23rd International Conference on Indium Phosphide and Related Materials, IPRM, May 22-26, 2011, Berlin, Germany.
Leuther, A. et al., "35 nm Metamorphic HEMT MMIC Technology," Fraunhofer Institute for Applied Solid-State Physics IAF, Freiburg, Germany.
Onishi, Toshikazu et al., "High power terahertz emission from a single gate AlGaN/GaN filed effect transistor with periodic Ohmic contacts for plasmon coupling," Applied Physics Letters 97, 092117, 2010.
Otsuji, T. et al., "Emission of terahertz radiation from dual grating gate plasmon-resonant emitters fabricated with InGaP/InGaAs/GaAs material systems," Journal of Physics: Condensed Matter 20, 384206, 2008.
Shur, M.S. et al., "Plasma Wave Electronics: Terahertz Sources and Detectors Using Two Dimensional Electronic Fluid in High Electron Mobility Transistors," 1998 IEEE Sixth International Conference, Sep. 3, 1998.
International Search Report dated Apr. 25, 2014 (PCT/EP2014/052685).

\* cited by examiner

RADIATION SOURCE AND METHOD FOR THE OPERATION THEREOF

FIELD OF THE DISCLOSURE

The invention relates to a radiation source, comprising at least one semiconductor substrate, on which at least two field effect transistors are formed. The invention also relates to a method for producing electromagnetic radiation having a vacuum wavelength between approximately 10 μm and approximately 1 mm, said method using an arrangement having at least two field effect transistors on a semiconductor substrate. Devices and methods of the above mentioned type can be used for producing far infrared and/or terahertz radiation. This part of the electromagnetic spectrum can be used for spectroscopy, for the non-destructive material testing, in safety engineering as well as in biology and medicine.

BACKGROUND

It is known from T. Otsuji, Y. M. Meziani, T. Nishimura, T. Suemitsu, W. Knap, E. Sano. T. Asano and V. V. Popov: "Emission of terahertz radiation from dual grating gate plasmon-resonant emitters fabricated with InGaP/InGaAs/GaAs material systems", J. Phys.: Condens. Matter 20 (2008) 384206, to equip a field effect transistor with a grating-like gate electrode. Adjacent contact surfaces of the grating-like gate electrode are connected to different electric potentials. As a result, plasmons are excited by the flow of electrons flowing in the channel of the field effect transistor. The plasmons have oscillation frequencies between approximately 600 gigahertz and approximately 3 terahertz, and therefore it is possible to excite corresponding electromagnetic waves. This known radiation source has, however, the drawback that the output is merely approximately 1 μW. Yet some technical applications require an output of about 1 mW.

It is known from Shur, M. S.; Lu, J.-Q.; Dyakonov, M. I.: Plasma wave electronics: terahertz sources and detectors using two dimensional electronic fluid in high electron mobility transistors. Terahertz Electronics Proceedings, 1998. THz Ninety Eight. 1998 IEEE Sixth International Conference, pages 127-130, that plasmon oscillations are excited in individual field effect transistors by an electric current between source and drain contacts. The excitation of plasmon oscillations calls for a high mobility of the charge carriers and a ballistic electron transport in the channel. The frequency of the plasmon oscillations excited in the field effect transistors, which is equal to the frequency f of the emitted electromagnetic radiation, has the following relation to the propagation velocity of surface plasmons s and the gate length of the field effect transistors $L_G$ $$f = \frac{s \cdot (2k-1)}{4L_G}$$

wherein k=1, 2, 3, .... The propagation velocity s of surface plasmons is at the order of $10^6$ m/s, thus leading to frequencies f of plasmonic waves and the corresponding emitted radiation in the terahertz range with gate lengths ranging from several nanometers to several hundred nanometers. The parameter k here defines the number of plasmonic half-waves which are formed on the gate length of the field effect transistors $L_G$ plus 0.5. Therefore, when k=1, plasmon oscillations are produced, the wavelength of which corresponds to four times the gate length $L_G$. When k=2, ¾ wavelengths of the plasmon oscillation are produced over the gate length $L_G$.

Proceeding from the prior art, the object of the invention is therefore to provide a radiation source for far infrared and/or terahertz radiation, which has a greater output.

This object is achieved by a radiation source according to claim 1 and a method according to claim 16.

SUMMARY

According to the invention, a radiation source is proposed where a plurality of field effect transistors all operate in the ballistic range and produce plasmonic oscillations due to their periodic arrangement, enhance these oscillations and decouple them as terahertz radiation. To this end, it is possible to use a semiconductor substrate and a device architecture which is suitable for field effect transistors if the latter have a sufficiently good combination of sufficiently great charge carrier mobility and sufficiently small channel length. Such combinations are possible according to the available prior art.

The invention proposes a radiation source which uses at least two field effect transistors on a semiconductor substrate for producing FIR radiation. The below description employs the term "far infrared radiation" or FIR radiation for electromagnetic radiation having a vacuum wavelength of approximately 10 μm to approximately 1 mm. This is radiation in what is called the terahertz gap of the electromagnetic spectrum and it has a longer wavelength than infrared radiation and a shorter wavelength than microwave radiation.

The radiation source is arranged on a semiconductor substrate. The semiconductor substrate can contain e.g. an elemental semiconductor, such as silicon or germanium. In some embodiments of the invention, the semiconductor substrate contains at least one nitride, e.g. gallium nitride or aluminum nitride. In some embodiments of the invention, the semiconductor substrate can contain a ternary or quaternary compound of an element of main group 3 of the periodic system and nitrogen. In other embodiments of the invention, the semiconductor substrate can contain at least one compound of an element of main group 3 and one element of main group 5. The element of main group 3 can here be selected from aluminum, gallium or indium. The element of main group 5 can be selected from phosphorus, arsenic or antimony. In some embodiments of the invention, the semiconductor substrate can contain or consist of at least one ternary or quaternary compound of elements of main groups 3 and 5. In some embodiments of the invention, at least part of the semiconductor substrate can have a multi-layer structure. Different layers can have a different composition so as to produce a semiconductor heterostructure. The semiconductor heterostructure can enable or facilitate the production of a two-dimensional electron gas.

The radiation source also contains at least one periodic arrangement of at least two field effect transistors. Each field effect transistor contains in each case one gate electrode, one source contact and one drain contact. The gate electrode, the source contact and the drain contact bound a channel in which a flow of electrons can be formed when the device is operated.

The at least two field effect transistors are arranged adjacent to one another on the substrate in the direction of the source-drain axis, wherein each field effect transistor has exactly one gate electrode, and at least one source contact and/or at least one drain contact is arranged between two adjacent gate electrodes.

Adjacent field effect transistors can have respectively assigned source contacts (S) and drain contacts (D) or can have a common source and drain contact. In some embodiments, the periodic order of the contacts on the substrate surface can therefore be . . . /source/gate/drain/gate/source/gate/drain/ . . . . In other embodiments, the order can be . . . /source/gate/drain/source/gate/drain/source/gate/drain/ . . . . In other embodiments the order can be . . . /source/source/gate/drain/drain/gate/source/source/gate/ . . . .

In some embodiments of the invention, at least some of the contacts can be arranged in the volume of the semiconductor substrate. In this case, each contact of the semiconductor substrate can have an assigned trench which accommodates at least part of the contact. In other embodiments of the invention, the contacts can be deposited on the surface of a semiconductor substrate before further semiconducting layers are deposited on the remaining exposed surface areas of the semiconductor substrate. The source and drain contacts are usually ohmic contacts, i.e. a charge carrier exchange between contact and semiconductor substrate can be carried out, and therefore the transition resistance between contact and semiconductor is small. This can be achieved by selecting the work function of the metal or the alloy of the contact and/or the charge carrier density of a semiconductor substrate area bordering on the contact in such a way that a desired Schottky barrier value is obtained.

The radiation source according to the invention also has at least one first gate electrode and at least one second gate electrode. The gate electrodes are either realized as Schottky contacts on the surface of the semiconductor substrate or separated from the semiconductor substrate by an insulating barrier. The insulating barrier can be made e.g. by a low-doped semiconductor material or an oxide, a nitride or an oxynitride. The gate electrodes as such are electrically conductive and can contain or consist of a doped polysilicon, a metal or an alloy, for example.

Source and drain contacts and the gate electrodes are arranged at a distance adjacent to one another on the surface of the substrate so as to avoid an electrical short circuit between the contacts. In some embodiments of the invention, the source and drain contacts have an identical structure. In this case, source and drain contacts merely differ by the electric voltage to be applied during the operation of the radiation source.

When the radiation source is operated, a second electric voltage is applied to the source contacts and a third electric voltage is applied to the drain contacts. A first electric voltage is applied to the gate electrodes and is chosen in such a way that a two-dimensional electron gas and a sufficient charge carrier density are formed in the channel of the field effect transistors. In the two-dimensional electron gas (2-DEG), a ballistic electron transport is formed when the radiation source is operated. The ballistic transport distinguishes itself in that the charge carriers inside the channel of the field effect transistor are not scattered by phonons or imperfections of the crystal lattice or the scatter does not dominate the transport. In some embodiments of the invention, the mean free path length can be two times as long as the length of the channel of a field effect transistor. In this case, the charge carriers can be described as quantum liquid flowing inside the channel. Furthermore, the channels of the field effect transistors form a high-quality resonator for the resulting plasmonic waves.

In some embodiments of the invention, the length of the channel of each of the field effect transistors can be less than 300 nm. In some embodiments of the invention, the length of the channel of each of the field effect transistors can be less than 30 nm. On the one hand, said channel lengths can be produced with common semiconductor technology and, on the other hand, are sufficiently short to ensure in the case of semiconductor heterostructures or elemental semiconductors having common impurities that the mean free path length is at least twice as long as the length of the channel of the field effect transistor. Of course, the channel length can also be longer when the field effect transistors having greater charge carrier mobility are available.

The above mentioned ballistic transport of the charge carriers leads to the excitation of plasmons. The plasmons are localized as plasma oscillations on the boundary between gate electrode and semiconductor substrate or on a boundary of a semiconductor heterostructure. The frequency of the plasma oscillation formed in the field effect transistor can be between approximately 300 GHz and approximately 80 THz. Therefore, an electromagnetic wave of corresponding frequency is emitted.

In some embodiments, the energy for exciting the plasmons can be supplied by a direct current. In some embodiments of the invention, a constant power source can be used for this purpose.

One plasmon oscillation each is produced in the channels of the field effect transistors formed on the semiconductor substrate and coupled in accordance with the invention. Therefore, each field effect transistor emits an electromagnetic radiation which can be superimposed structurally by the radiation emitted from further field effect transistors.

The emitted radiation can be enhanced by the antenna effect of the inventive arrangement which comprises two or more field effect transistors. According to the invention, it has been found that field effect transistors which are periodically arranged adjacent to one another collectively enhance the plasmonic oscillations produced separately by them and collectively act as an antenna which decouples these oscillations as terahertz radiation.

The above described structure of two coupled field effect transistors can be continued periodically so as to create a plurality of field effect transistors on the semiconductor substrate. The output of the emitted electromagnetic radiation is multiplied analogously. For example, approximately 500 to approximately 2000 field effect transistors can be formed on the semiconductor substrate in the described way. Therefore, an output which is about 500 times to about 2000 times as high is emitted as an electromagnetic wave. In another embodiment of the invention, the number of field effect transistors on the semiconductor substrate can be between about 800 and about 1200. Correspondingly, an output which is about 800 times to about 1200 times as high is emitted as an electromagnetic wave.

In some embodiments of the invention, the geometric dimensions of the field effect transistors on the semiconductor substrate can be selected in such a way that at least the plurality of source and drain contacts and optionally also the gate electrodes create a one-dimensional diffraction grating for the reflection of the plasmons. In some embodiments of the invention, the diffraction grating can be a Bragg grating or contain a Bragg grating. The incorporation of the gate electrodes here leads to a reduction in the grating constant of the diffraction grating, and therefore it is possible to emit a shorter wavelength of the resulting electromagnetic radiation while the structural size of the radiation source remains equal. The realization of the radiation source as a diffraction grating leads to multiple reflections of the plasmons which are supplied with energy from the flow of electrons in the channels of the field effect transistors. The energy supply to the plasmons increases the intensity of the electromagnetic radiation emitted by the plasmons since the diffraction grating serves as an antenna for the resulting electromagnetic wave.

In some embodiments of the invention, the period Λ of the diffraction grating complies with the following condition:

$$\Lambda = \frac{4nL_G}{2k-1},$$

wherein $L_G$ is the gate length of the field effect transistors and n and k are natural numbers, wherein k can adopt values of 1 to 2n. Proceeding from individual transistors, this ratio can effect a structural superimposition of partial waves and a particularly good coupling of the plasmons with the electromagnetic field of the emitted FIR radiation. As regards said geometric dimensions, a wave vector adaptation is obtained, i.e. $k_p-k_r=n\cdot G$, wherein $k_p$ is the wave vector of the plasmons, $k_r$ is the wave vector of the electromagnetic radiation and G is the reciprocal grating vector of the diffraction grating, i.e.

$$G = \frac{2\pi}{\Lambda}.$$

Due to said geometric dimensions, the diffraction grating acts as an antenna for the produced FIR radiation. The parameter n here designates an antenna dilution factor, i.e. the greatest possible areal density of elements of the diffraction grating is achieved when n=1.

As to the simplest case, i.e. n=k=1, there applies $\Lambda=4L_G$. In this case, it is possible to provide a compact radiation source with high efficiency.

In some embodiments of the invention, the natural frequencies of the plasmons localized inside the channels of the field effect transistors resonate with the frequency of the emitted radiation. As a result, it is possible to couple the electromagnetic field with the plasmon oscillation in a particularly efficient way.

In some embodiments of the invention, the source and drain contacts and the gate electrodes all have the same width L. This permits a particularly simple production of the radiation source according to the invention.

In some embodiments of the invention, the distance $L_{SP}$ between a gate electrode and an adjacent contact is three times as long as the width L of the contact and/or the gate electrode.

In some embodiments of the invention, the radiation source can have a width of approximately 2.5 μm to approximately 250 μm. In this case, the width of the radiation source is approximately a quarter of the wavelength of the emitted electromagnetic radiation, and therefore the radiation source can be considered a λ/4 antenna and an efficient decoupling of the electromagnetic radiation is ensured. The dimensions are sufficient to arrange about 10 to about 8500 field effect transistors in this area.

In some embodiments of the invention, the radiation source also contains fourth contacts which are disposed adjacent to the arrangement of the first contacts on the substrate, the second contacts and the third contacts. In some embodiments of the invention, the same electric potentials can be applied to the fourth contacts and the adjacent source and drain contacts when the apparatus is operated. As a result, the plasmons can be focused on the channels of the field effect transistors and a drop in the intensity on the margins of the diffraction grating can be avoided.

In some embodiments of the invention, the mobility $\mu_e$ of the electrons in the channel is greater than approximately 8000 cm$^2\cdot$(Vs)$^{-1}$ or greater than approximately 9500 cm$^2\cdot$(Vs)$^{-1}$. This ensures a minor damping of the flow of electrons in the channel, and therefore a plasmon oscillation of sufficient intensity can be formed.

In some embodiments of the invention, the radiation source can be part of a catheter which can be introduced into a body cavity of a living being. For example, the catheter can be introduced into the alimentary canal, a bloodstream, the vertebral canal, a respiratory organ or another body part which is not mentioned herein. In other embodiments of the invention, the radiation source can be part of a capsule which can be swallowed so as to be able to carry out a diagnosis and/or therapy using FIR radiation during the following stomach-intestine passage. This permits the diagnostic or therapeutic application of the FIR radiation directly to a focus of a disease or an organ system, thus enabling an improved therapeutic effect and/or a better diagnosis and/or improved imaging methods. In some embodiments of the invention, the radiation source can be part of a probe which can be introduced into cavities of technical devices. Thus, e.g. combustion chambers, car body cavities, conduits or other technical devices can be investigated from inside or the timing of combustion processes can be shown.

BRIEF DESCRIPTION OF THE DRAWINGS

The invention shall be explained in more detail below without limiting the general inventive concept, wherein.

DETAILED DESCRIPTION

Figure 1:
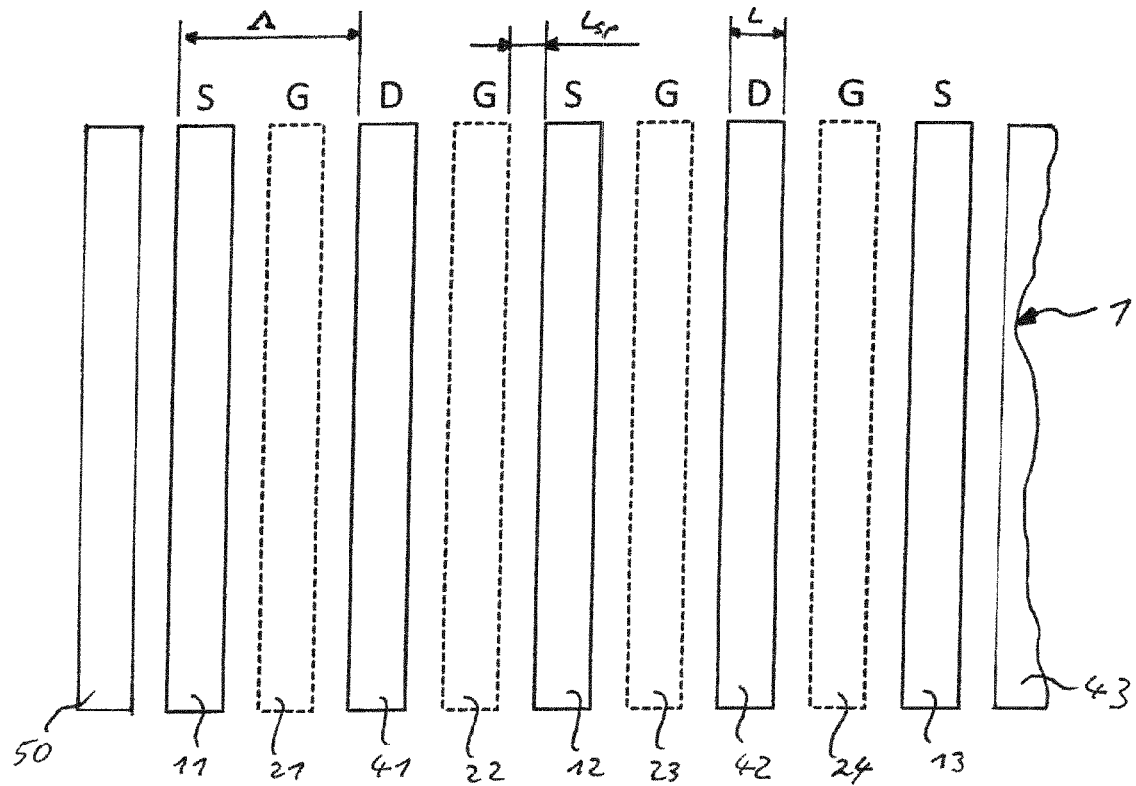
FIG. 1 shows a top view of a radiation source according to the invention.

FIG. 1 shows a top view of a radiation source according to the present invention. The radiation source 1 contains a semiconductor substrate on which a plurality of source contacts 11, 12 and 13, a plurality of drain contacts 41, 42, and 43 and gate electrodes 21, 22, 23, 24 are arranged. A first gate electrode 21 is disposed between the first source contact 11 and the first drain contact 41. A second gate electrode 22 is disposed between the first drain contact 41 and the second source contact 12. Together with the layers which are arranged in the substrate 10 and which are explained below by means of FIGS. 2 and 3, the first source contact 11 forms a first field effect transistor 31 together with the first drain contact 41 and the first gate electrode 21. Likewise, the first drain contact 41, the second source contact 12 and the second gate electrode 22 form a second field effect transistor 32. The structure explained by way of example by means of FIG. 1 can be continued periodically so as to arrange several hundred or several thousand source and drain contacts and gate electrodes on the surface of the semiconductor substrate. Consequently, a plurality of field effect transistors 31, 32, 33, 34 . . . is arranged on the substrate.

In the exemplary embodiment shown, adjacent transistors of the periodic arrangement share, in each case, a source or drain contact. In other embodiments of the invention, dedicated source and drain contacts can be available for each field effect transistor.

In the exemplary embodiment shown, all source and drain contacts and gate electrodes have the same width L. In some embodiments of the invention, the width L can be between approximately 3 nm and approximately 300 nm in order that the natural frequencies of the plasmons in the channel correspond to the respective frequency of the FIR radiation. In some embodiments of the invention, the distance $L_{SP}$ between the gate electrodes and the respectively adjacent source and drain contacts can be three times the width of the contacts, i.e. $L_{SP}=3L$. The periodic arrangement of the field effect transistors on the surface of the semiconductor substrate can have a width of approximately 2.5 µm to approximately 250 µm, and therefore the width is approximately a quarter of the wavelength of the electromagnetic radiation produced by the radiation source.

The first contacts 11, the second contacts 12, the third contacts 13 and the assigned gate electrodes 21, 22, 23 and 24 can have a longitudinal extension of approximately 100 nm to approximately 2000 µm or of approximately 500 nm to approximately 2500 µm or of approximately 100 nm to approximately 250 µm.

Furthermore, FIG. 1 shows optional fourth contacts 50 on the margin. Said contacts can be disposed on the same electric potential as the adjacent source or drain contacts 11. The fourth contacts 50 can serve for preventing the drop in the plasmonic waves on the margins of the arrangement. In some embodiments of the invention, the optional fourth contacts 50 can ensure, for the field effect transistors arranged on the margin, an antenna effect which is equal or similar to that of the transistors inside the arrangement.

The periodic arrangement of the source and drain contacts does not only form the field effect transistors, as described above, but simultaneously a diffraction grating for the plasmonic waves resulting in the channels. For this purpose, the source contacts (11, 12, 13) and the drain contacts are arranged in such a way that adjacent source contacts (11, 12, 13) and drain contacts (41, 42, 43) all have a distance Λ relative to one another that complies with the following condition:

$$\Lambda = \frac{4nL_G}{2k-1},$$

wherein $L_G$ is the gate length of the field effect transistors (31, 32, 33, 34) and n and k are natural numbers, wherein k can adopt values from 1 to 2n. As a result, at least a partial surface has a periodic arrangement of source and/or drain contacts.

Figure 2:
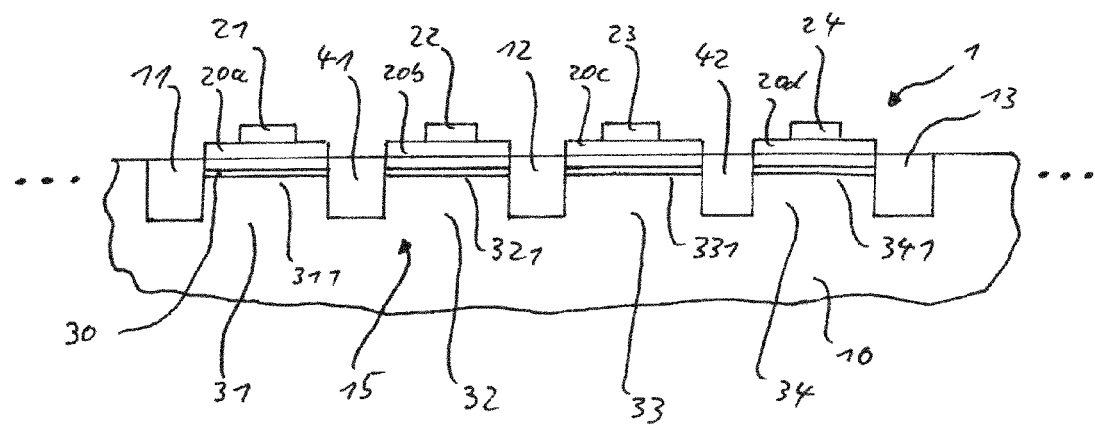
FIG. 2 shows a cross-section through a radiation source according to a first embodiment of the invention.

FIG. 2 shows a cross-section through a radiation source according to a first embodiment of the invention. Equal components are provided with equal reference signs, and therefore the description is limited to the essential differences. FIG. 2 shows a semiconductor substrate 10 which may contain a III/V compound semiconductor, for example. A heterostructure 30 can be formed in substrate 10 and can produce a 2-DEG in channel 311, 321, 331 and 341 of the field effect transistors 31, 32, 33 and 34.

Furthermore, it is evident from FIG. 2 how to introduce source and drain contacts 11, 12, 13, 41, 42 and 43 into substrate 10 to produce appropriate field effect transistors 31, 32, 33 and 34. On the one hand, contacts 41, 42, 43, 11, 12 and 13 serve for electrically contacting the semiconductor heterostructure 30 to enable a ballistic flow of electrons between adjacent source and drain contacts. At the same time, at least some of the plasmons created in channels 311, 321, 331 and 341 are reflected by contacts 41, 42, 43, 11, 12 and 13 in such a way that contacts 41, 42, 43, 11, 12 and 13 also produce a one-dimensional diffraction grating 15 for the plasmons. This diffraction grating likewise acts as an antenna for the produced FIR radiation. The grating constant Λ is given by the distance of adjacent contacts and their width, as illustrated in FIG. 1 by way of example.

The gate contacts 21, 22, 23 and 24 are arranged on insulation layers 20a, 20b, 20c and 20d. The insulation layers 20 can contain or consist of an oxide, a nitride or an oxynitride, for example. During the operation of the radiation source, the gate voltage is chosen in such a way that sufficient charge carriers are formed in the channel of the field effect transistor. Furthermore, the third electric voltage ($V_{drain}$) can be selected in such a way that the current transported in the channel reaches saturation.

In some embodiments of the invention, the third electric voltage ($V_{drain}$) can be chosen depending on the charge carrier mobility µ, the effective electron mass $m_{eff}$ and the gate length $L_G$ in such a way that $$\frac{\mu^2 \cdot m_{eff} \cdot V_{Drain}}{e \cdot L_G^2} > 1,$$

wherein e designates the elementary charge. In this case, the condition for a ballistic transport of the charge carriers in the channel is complied with, and therefore plasmon oscillations with high efficiency are excited. The third electric voltage ($V_{drain}$) is here chosen depending on the gate length $L_G$ below the material-dependent breakdown field strength. For example, the field strength $$V_{Drain}/L_G$$

can be less than $1 \cdot 10^5$ V·cm$^{-1}$ when the radiation source contains or consists of germanium. The field strength $$V_{Drain}/L_G$$

can be less than $3 \cdot 10^5$ V·cm$^{-1}$ when the radiation source contains or consists of silicon. The field strength $$V_{Drain}/L_G$$

can be less than $4 \cdot 10^5$ V·cm$^{-1}$ when the radiation source contains or consists of GaAs. The field strength $$V_{Drain}/L_G$$

can be less than $2.2 \cdot 10^6$ V·cm$^{-1}$ when the radiation source contains or consists of SiC. The field strength $$V_{Drain}/L_G$$

can be less than $5.0 \cdot 10^5$ V·cm$^{-1}$ when the radiation source contains or consists of InP. The field strength $$V_{Drain}/L_G$$

can be less than $5.0 \cdot 10^6$ V·cm$^{-1}$ when the radiation source contains or consists of GaN.

In some embodiments of the invention, the gate length $L_G$ of at least one transistor of the radiation source can be chosen depending on the material parameters, i.e. charge carrier mobility µ and effective electron mass $m_{eff}$, in such a way that $$\frac{\mu^2 \cdot m_{eff}}{e \cdot L_G} \geq a,$$

wherein e designates the elementary charge and a is a constant. In some embodiments of the invention, the constant a can be chosen from an interval of $4 \cdot 10^{-7}$ cm·V$^{-1}$ to $1 \cdot 10^{-5}$ cm·V$^{-1}$. The constant a can be greater than $1 \cdot 10^{-5}$ cm·V$^{-1}$ when the radiation source contains or consists of germanium. The constant a can be greater than $3.3 \cdot 10^{-6}$ cm·V$^{-1}$ when the radiation source contains or consists of silicon. The constant a can be greater than $2.5 \cdot 10^{-6}$ cm·V$^{-1}$ when the radiation source contains or consists of GaAs. The constant a can be greater than $4.5 \cdot 10^{-7}$ cm·V$^{-1}$ when the radiation source contains or consists of SiC. The constant a can be greater than $2.0 \cdot 10^{-7}$ cm·V$^{-1}$ when the radiation source contains or consists of GaN. The constant a can be greater than $2.0 \cdot 10^{-6}$ cm·V$^{-1}$ when the radiation source contains or consists of InP.

It should be noted that in other embodiments of the invention the semiconductor heterostructure 30 can also be omitted so as to obtain the two-dimensional electron gas on the basis of the band bending induced by the gate voltage. In some embodiments, at least two contacts 11, 41 and at least one gate electrode 21 can form a field effect transistor having high electron mobility (HEMT). The mobility $\beta_e$ of the electrons in the channel can then be higher than approximately 8000 cm$^2 \cdot$(Vs)$^{-1}$ or higher than approximately 9500 cm$^2 \cdot$(Vs)$^{-1}$.

The plasmonic waves forming in the semiconductor heterostructure 30 and/or underneath a boundary of the gate electrodes, all produce electromagnetic FIR radiation. The respective partial intensities emitted from the field effect transistors can sum up, thus yielding a radiation source of high intensity and/or high brilliance.

Figure 3:
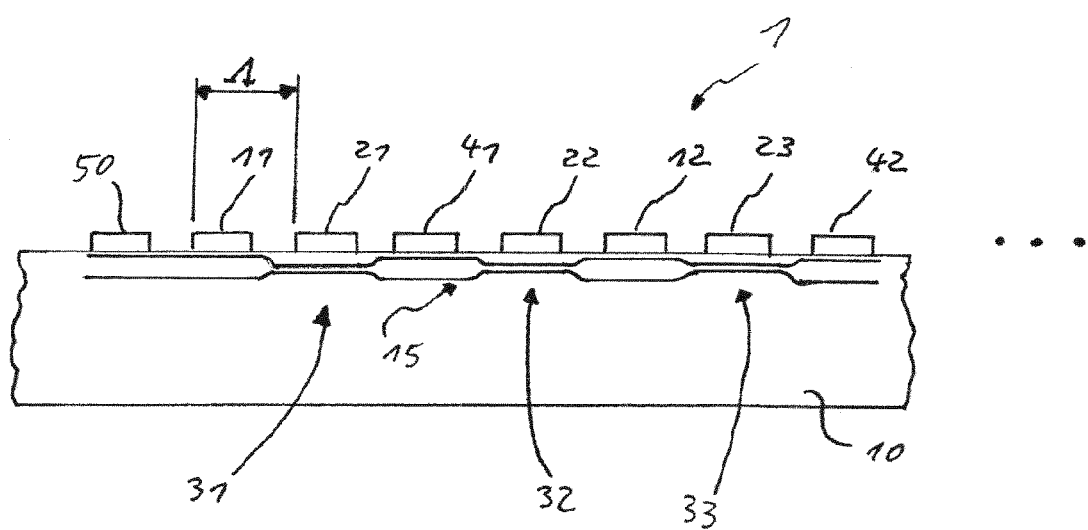
FIG. 3 shows a cross-section through a radiation source according to a second embodiment of the invention.

FIG. 3 shows a section of a second embodiment of the present invention. Equal constituents of the invention are provided with equal reference signs, and therefore the following description is limited to the essential differences.

The second embodiment also has a semiconductor substrate 10. An optional semiconductor heterostructure can be deposited on the semiconductor substrate 10 and can provide a 2-DEG having a high charge carrier mobility. In contrast to the first embodiment, the source contacts 11 and 12, the drain contacts 41 and 42 and the gate electrodes 21, 22 and 23 are not arranged in trenches inside the substrate 10. The contacts 41, 42, 11 and 12 are rather formed as ohmic contacts on the surface of the semiconductor substrate. This can considerably facilitate the production of the radiation source.

The gate electrodes 21, 22 and 23 are also formed as a metal layer on the surface of the semiconductor substrate 10. The gate electrodes 21, 22 and 23 are made as Schottky contacts. In some embodiments of the invention, this can be effected by using a metal or an alloy having more or less work function. The production of the radiation source 1 then merely calls for the production of the corresponding contacts and gate electrodes by depositing and structuring two different metal layers on the semiconductor substrate 10 with the heterostructure 30.

In some embodiments of the invention, the surface of the semiconductor substrate 10 can be removed at least in some segments by etching to expose the heterostructure 30. As a result, the production of the ohmic contacts and/or the Schottky contacts can be facilitated or the quality thereof can be improved. In some embodiments of the invention, at least some areas of the semiconductor substrate 10 can be doped so as to be conductive to provide ohmic contacts having better quality. In some embodiments of the invention, at least some areas of the semiconductor substrate 10 can be sparsely doped and/or insulated and/or poorly conductive to provide Schottky contacts having better quality.

However, since contacts 41, 42, 11 and 12 are ohmic contacts and the gate electrodes are Schottky contacts, the effect thereof on the electrodes in the heterostructure 30 is different. Nevertheless, all metallizations have a similar influence on the plasmons forming, and therefore the grating constant Λ of the resulting diffraction grating 15 and/or of the antenna formed by the diffraction grating 15 is smaller than in the first exemplary embodiment. The smaller grating constant Λ can have an advantageous effect on the formation and amplification of the plasmons and/or the FIR radiation emission when the radiation source is operated. As a result, the second embodiment shown in FIG. 3 can have a higher intensity electromagnetic radiation and/or provide a radiation having higher frequency. The plasmons forming in the channels of the field effect transistors couple electromagnetically with the grating produced by the metallizations 41, 42, 11, 12, 21, 22 and 23. This grating acts like an antenna, thus converting the plasmons into free electromagnetic radiation.

In some embodiments of the invention, the semiconductor substrate 10 and/or the ohmic contacts 41, 42, 11 and 12 and/or the Schottky contacts 21, 22 and 23 can consist of or obtain a material which absorbs FIR radiation to a minor degree.

1$^{st}$ Exemplary Embodiment

A radiation source according to the invention contains field effect transistors which are produced from GaAs on a semiconductor substrate. The mobility $\mu_e$ of the electrons is $\mu_e = 9500$ cm$^2 \cdot$(Vs)$^{-1}$. The effective mass $m_{eff}$ of the electrons in the semiconductor is $0.067$ $m_o$, wherein $m_o$ designates the mass of the free electron. The individual field effect transistors of the radiation source all have a gate length of 300 nm. The field effect transistors are operated by a third voltage $V_{drain}$ of 1 V. Therefore, the following applies:

$$\frac{\mu^2 \cdot m_{eff} \cdot V_{Drain}}{e \cdot L_G^2} = 4.06 > 1,$$

i.e. a ballistic transport of the electrons occurs in the channel of the field effect transistors. As a result, such a radiation source can emit FIR radiation.

2$^{nd}$ Exemplary Embodiment

A radiation source according to the invention contains field effect transistors which are arranged on a semiconductor substrate made of silicon. The mobility $\mu_e$ of the electrons is $\mu_e$=300 cm$^2$·(Vs)$^{-1}$. The effective mass $m_{eff}$ of the electrons in the semiconductor is 0.36 $m_o$, wherein $m_o$ is the mass of the free electron. Each of the individual field effect transistors of the radiation source has a gate length of 15 nm. The field effect transistors are operated with a third voltage $V_{drain}$ of 1 V. Therefore, the following applies:

$$\frac{\mu^2 \cdot m_{eff} \cdot V_{Drain}}{e \cdot L_G^2} = 8.19 > 1,$$

i.e. a ballistic transport of the electrons occurs in the channel of the field effect transistors. Therefore, such a radiation source can emit FIR radiation.

3$^{rd}$ Exemplary Embodiment

A radiation source according to the invention contains field effect transistors which are arranged on a semiconductor substrate made of silicon. The mobility $\mu_e$ of the electrons is $\mu_e$=300 cm$^2$·(Vs)$^{-1}$. The effective mass $m_{eff}$ of the electrons in the semiconductor is 0.36 $m_o$, wherein $m_o$ is the mass of the free electron. Each of the individual field effect transistors of the radiation source has a gate length of 30 nm. The field effect transistors are operated with a third voltage $V_{drain}$ of 1 V. Therefore, the following applies:

$$\frac{\mu^2 \cdot m_{eff} \cdot V_{Drain}}{e \cdot L_G^2} = 2.36 > 1,$$

i.e. a ballistic transport of the electrons only just occurs in the channel of the field effect transistors. Thus, such a radiation source can also emit FIR radiation.

Comparative Example

A field effect transistor is arranged on a semiconductor substrate made of silicon. The mobility $\mu_e$ of the electrons is $\mu_e$=300 cm$^2$·(Vs)$^{-1}$. The effective mass $m_{eff}$ of the electrons in the semiconductor is 0.36 $m_o$, wherein $m_o$ designates the mass of the free electron. Each of the individual field effect transistors of the radiation source has a gate length of 100 nm. The field effect transistors are operated with a third voltage $V_{drain}$ of 1 V. Therefore, the following applies:

$$\frac{\mu^2 \cdot m_{eff} \cdot V_{Drain}}{e \cdot L_G^2} = 0.18 < 1,$$

i.e. there is no ballistic transport of the electrons in the channel of the field effect transistor. Thus, no radiation source according to the invention can be realized on the basis of such transistors.

Of course, the invention is not limited to the embodiments shown in the figures. Therefore, the above description should not be considered to be limiting but explanatory. The below claims should be understood to the effect that an indicated feature is available in at least one embodiment of the invention. This does not exclude the presence of further features. If the claims and the above description define "first" and "second" features, this designation serves for distinguishing between two similar features without determining an order.

The invention claimed is:

1. A radiation source, comprising at least one semiconductor substrate on which at least two field effect transistors are formed, each of which has a gate electrode having a gate length $L_G$, a source contact and a drain contact, which bound a channel, wherein
the at least two field effect transistors are arranged adjacent to one another on the substrate, wherein each field effect transistor has exactly one gate electrode, and at least one source contact and/or at least one drain contact is arranged between two adjacent gate electrodes, wherein adjacent source contacts and/or drain contacts all have a distance $\Lambda$ with respect to one another, which complies with the following condition:

$$\Lambda = \frac{4nL_G}{2k - 1},$$

wherein $L_G$ is the gate length of the field effect transistors and n and k are natural numbers, wherein k can adopt values from 1 to 2n,
wherein the plurality of source contacts and drain contacts create a one dimensional diffraction grating for plasmonic waves resulting in the channels.

2. The radiation source according to claim 1, wherein a two-dimensional electron gas is formed in the channel of the field effect transistors, at least when the radiation source is operated.

3. The radiation source according to claim 1, wherein the plurality of source contacts and drain contacts is between approximately 1000 and approximately 4000.

4. A radiation source according to claim 1, wherein a ballistic electron transport is formed in the channel when the radiation source is operated.

5. The radiation source according to claim 1, wherein the source contacts and the drain contacts and the gate electrodes all have equal widths $L_G$.

6. The radiation source according to claim 1, wherein the channel length is less than 300 nm.

7. The radiation source according to claim 1, wherein the mean free path length of the electrons in the channel is longer than twice the width $L_G$.

8. The radiation source according to claim 1, wherein the mobility $\mu_e$ of the electrons in the channel is greater than approximately 8000 cm$^2$·(Vs)$^{-1}$.

9. The radiation source according to claim 1, wherein the semiconductor substrate contains or consists of Si or a III-V compound semiconductor or
that the semiconductor substrate contains or consists of InP and/or GaAs and/or InAlGaAs and/or InGaAs and/or InAlAs.

10. The radiation source according to claim 1, wherein the gate electrodes, the source contacts and the drain contacts are arranged parallel to one another.

11. The radiation source according to claim 1, wherein the gate length $L_G$ of at least one transistor of the radiation source is selected depending on the material parameters, i.e. charge carrier mobility $\mu$ and effective electron mass $m_{eff}$, in such a way that $$\frac{\mu^2 \cdot m_{\mathit{eff}}}{e \cdot L_G} \geq a,$$

wherein e is the elementary charge and a is a constant.

12. The radiation source according to claim 11, wherein the constant a is selected from the interval of $4 \cdot 10^{-7}$ cm·V$^{-1}$ to $1 \cdot 10^{-5}$ cm·V$^{-1}$.

13. The radiation source according to claim 1, further containing a constant power source.

14. A probe or catheter having a radiation source according to claim 1.

15. A method for producing electromagnetic radiation having a vacuum wavelength between approximately 10 μm and approximately 1 mm, said method using an arrangement having at least two field effect transistors which are arranged on a semiconductor substrate and each of which contains a gate electrode having a gate length $L_G$, a source contact and a drain contact, which bound a channel, wherein the at least two field effect transistors are arranged adjacent to one another on the substrate, wherein each field effect transistor has exactly one gate electrode, and at least one source contact and/or at least one drain contact is arranged between two adjacent gate electrodes, wherein adjacent source contacts and/or drain contacts all have a distance Λ with respect to one another, which complies with the following condition:

$$\Lambda = \frac{4nL_G}{2k-1},$$

wherein $L_G$ is the gate length of the field effect transistors and n and k are natural numbers, wherein k can adopt values from 1 to 2n, wherein the plurality of source contacts and drain contacts create a one dimensional diffraction grating for plasmonic waves resulting in the channels, wherein a first electric voltage ($V_{gate}$) is applied to the gate electrodes and a second electric voltage ($V_{source}$) is applied to the source contacts and a third electric voltage ($V_{drain}$) is applied to the drain contacts so as to create between the source contacts and the drain contacts in each case a ballistic flow of electrons which excites plasmon oscillations in at least one channel of the field effect transistors.

16. The method according to claim 15, wherein the second electric voltage ($V_{source}$) is zero and/or a mass potential and/or the third electric voltage ($V_{drain}$) is selected in such a way that the current supplied to or drained from the source contact reaches saturation.

17. The method according to claim 15, wherein in each case a two-dimensional electron gas is formed between the source and drain contacts.

18. The method according to claim 15, characterized in that wherein the third electric voltage ($V_{drain}$) is selected depending on the charge carrier mobility μ, the effective electron mass $m_{\mathit{eff}}$ and the gate length $L_G$ in such a way that $$\frac{\mu^2 \cdot m_{\mathit{eff}} \cdot V_{Drain}}{e \cdot L_G^2} > 1,$$

wherein e designates the elementary charge.

19. The method according to claim 15, wherein a constant electric current is supplied to the arrangement.

20. The method according to claim 15, wherein the electromagnetic waves excited in the respective field effect transistors interfere with one another in a constructive way.

* * * * *